United States Patent
Petrov et al.

(10) Patent No.: US 8,773,184 B1
(45) Date of Patent: Jul. 8, 2014

(54) FULLY INTEGRATED DIFFERENTIAL LC PLL WITH SWITCHED CAPACITOR LOOP FILTER

(71) Applicant: Futurewei Technologies, Inc., Plano, TX (US)

(72) Inventors: Dmitry Petrov, Ottawa (CA); Paul Madeira, Nepean (CA)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/860,138

(22) Filed: Apr. 10, 2013

Related U.S. Application Data

(60) Provisional application No. 61/780,762, filed on Mar. 13, 2013.

(51) Int. Cl.
*H03L 7/06* (2006.01)
*H03L 7/091* (2006.01)

(52) U.S. Cl.
CPC .................................... *H03L 7/091* (2013.01)
USPC .......................................... 327/157; 327/148

(58) Field of Classification Search
USPC .................................. 327/148, 157
See application file for complete search history.

(56) References Cited

U.S. PATENT DOCUMENTS

| | | | | |
|---|---|---|---|---|
| 5,594,390 | A * | 1/1997 | Holzer | 331/17 |
| 6,429,734 | B1 * | 8/2002 | Wang et al. | 327/558 |
| 7,023,249 | B1 * | 4/2006 | Mulbrook | 327/156 |
| 7,030,688 | B2 * | 4/2006 | Dosho et al. | 327/558 |
| 2003/0076175 | A1 * | 4/2003 | Fischer et al. | 331/17 |
| 2005/0077955 | A1 * | 4/2005 | Dosho et al. | 327/558 |
| 2012/0200327 | A1 * | 8/2012 | Sreekiran et al. | 327/157 |
| 2013/0229213 | A1 * | 9/2013 | Park et al. | 327/157 |

OTHER PUBLICATIONS

Lim, Peter J., "An Area-Efficient PLL Architecture in 90-nm CMOS," Symposium on VLSI Circuits Digest of Technical Papers, 2005, pp. 48-49.

* cited by examiner

*Primary Examiner* — Adam Houston
(74) *Attorney, Agent, or Firm* — Conley Rose, P.C.; Grant Rodolph; Rayhao A. Chung

(57) ABSTRACT

A circuit comprising a loop filter, wherein the filter comprises an active integrator configured to generate one or more tuning signals, and a voltage-controlled oscillator (VCO) coupled to the loop filter and configured to generate a feedback signal based on the one or more tuning signals, wherein generating the one or more tuning signals is based on the feedback signal.

20 Claims, 7 Drawing Sheets

FULLY INTEGRATED DIFFERENTIAL LC PLL WITH SWITCHED CAPACITOR LOOP FILTER

CROSS-REFERENCE TO RELATED APPLICATIONS

The present application claims priority to U.S. Provisional Patent Application No. 61/780,762 filed Mar. 13, 2013 by Dmitry Petrov et al. and entitled "Fully Integrated Differential LC PLL with Switched Capacitor Loop Filter", which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A phase-locked loop or phase lock loop (PLL) is an electrical circuit that generates an output signal. A phase of the output signal may be related to a phase of an input reference signal. A PLL circuit may comprise a phase frequency detector (PFD), a charge pump (CP), a loop filter, and a voltage-controlled oscillator (VCO). In use, the PFD may compare the phase of the input reference signal with the phase of a signal derived from an output of the VCO. The PLL may adjust the frequency of its oscillator output to keep the two phases matched. To form a PLL circuit, the PFD may generate an output representing an error between the input reference and the oscillator. The error signal may be fed to the loop filter, which may integrate the signal to smooth it. Then, the smoothed signal may be fed into the VCO, which may generate an output signal with a frequency that is proportional to the smoothed signal (e.g., a tuning voltage signal). The VCO output may also be fed back to the PFD to complete the loop structure of the PLL.

Frequency is a time derivative of phase. Keeping the input and output phase in a locked state may imply keeping the input and output frequencies in a locked state. Consequently, a phase-locked loop may track an input frequency, or it may generate a frequency that is a multiple of the input frequency.

Conventionally, a PLL may comprise a passive loop filter (PLF) that operates in a passive mode. No active internal components substituting external loop filter may be included in the PLF. Consequently, the PLF may need one or more external capacitors to achieve a required loop dynamic. The external capacitors may occupy precious space on the PLL die, which may be undesirable especially when the external capacitors have relatively large capacitances (e.g., greater than 1 nanofarad (nF)).

SUMMARY

In one embodiment, the disclosure includes a circuit comprising a loop filter, wherein the filter comprises an active integrator configured to generate one or more tuning signals, and a voltage-controlled oscillator (VCO) coupled to the loop filter and configured to generate a feedback signal based on the one or more tuning signals, wherein generating the one or more tuning signals is based on the feedback signal.

In another embodiment, the disclosure includes a method implemented by a VCO comprising receiving a tuning voltage, and generating an oscillating signal whose frequency is based on the tuning voltage, wherein a relationship between the tuning voltage and the frequency of the oscillating signal is characterizable via frequency versus voltage curves, and wherein generating the oscillating signal is performed in a way such that spacings between frequency versus voltage curves are linear and a slope of the frequency versus voltage curves is substantially constant.

In yet another embodiment, the disclosure includes a phase lock loop (PLL) comprising an active low pass filter configured to generate one or more tuning signals, and a VCO coupled to the active low pass filter and configured to generate a feedback signal based on the one or more tuning signals, and feed the feedback signal to the active low pass filter.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
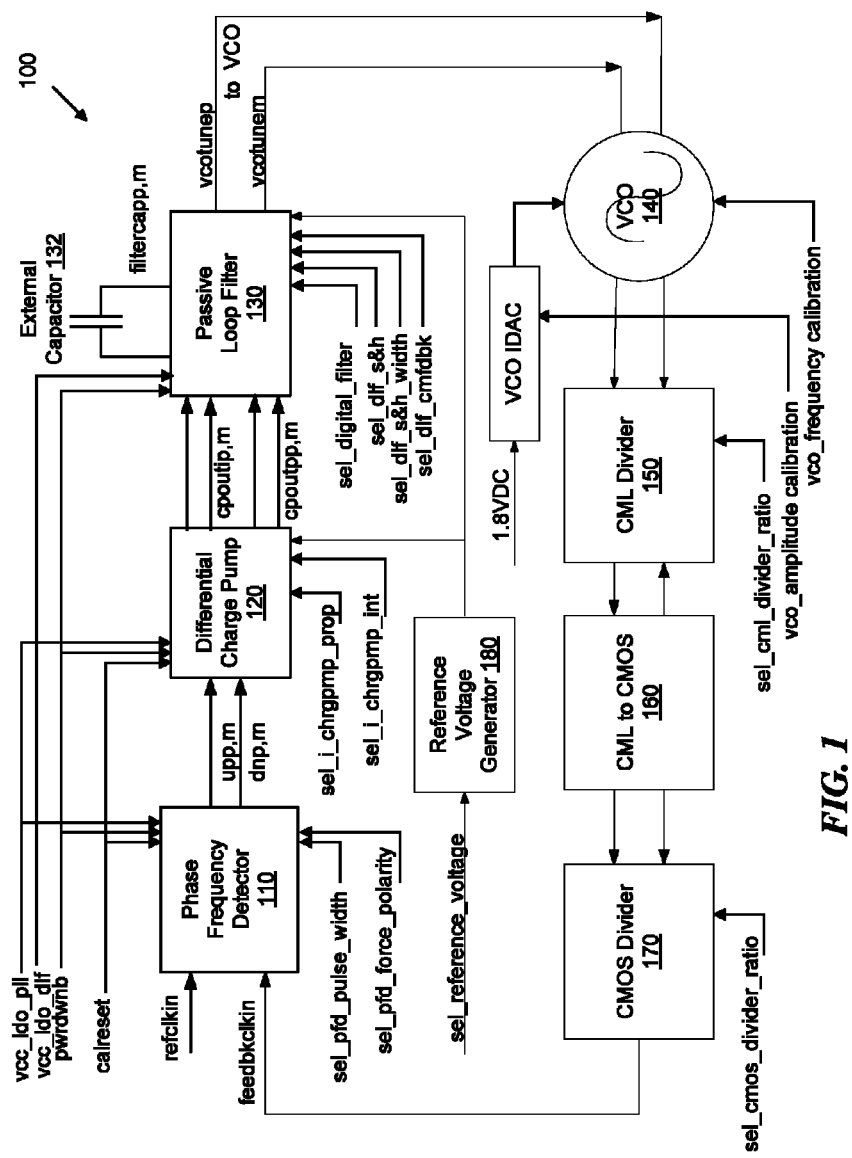
FIG. 1 is a high level schematic diagram of a PLL.

The so-called passive mode may be a conventional PLL utilizing one or more external capacitors to achieve a required loop dynamic. FIG. 1 is a high level schematic diagram of a PLL 100, which may operate in a passive mode. The PLL circuit 100 comprises a control path and a feedback path coupled to the control path. The control path may include a traditional 3-state phase-frequency detector (PFD) 110, a differential charge pump (CP) 120, and a loop filter (LF) 130. The feedback path may include a voltage-controlled oscillator (VCO) 140, a current mode logic (CML) divider 150, a CML to complementary metal-oxide-semiconductor (CMOS) converter 160, and a CMOS divider 170 (sometimes called a VCO edge counter). The CML divider 150 and the CMOS divider 170 may be high frequency dividers.

Signal notations in FIG. 1 may be defined as follows:

Vcc_ldo_pll denotes a direct current (DC) supply voltage (e.g., 0.9-1.1 volts) used to provide power for some modules or units in the PLL 100, such as the PFD 110 and the CP 120;

Vcc_ldo_divider denotes a DC supply voltage (e.g., 0.9-1.1 volts) used to provide power for divider sub-circuits, such as the CML divider 150 and/or the CMOS divider 170;

pwrdwnb denotes an enabling signal (e.g., a high pwrdwnb may power up the loop filter 130 and the CP 120);

calreset denotes a control signal for calibration reset (e.g., a high calreset may set the PLL 100 in a VCO frequency calibration mode, disconnecting the charge pump 120 from the loop filter 130, and shorting "vcotunep" and "vcotunem" to a reference voltage denoted as "vref");

vref denotes a reconfigurable DC reference voltage, which may, for example, change about +/−20% around half of Vcc_ldo_dlf;

refclkin denotes an input reference clock;

feedbkclkin denotes an input feedback clock;

sel_pfd_pulse_width denotes a control signal for pulse width selection for the PFD;

sel_pfd_force_polarity denotes a control signal for force polarity selection for the PFD;

upp and upm (sometimes in short as upp, m) denote positive (P) and negative (M) pull-up signals;

dnp and dnm denote positive and negative pull-down signals;

sel_i_chrgpmp_prop denotes a control signal for selection of current level for a proportional path of the CP 120, which may serve as a single main CP in the passive mode;

cpoutpp and cpoutpm denote positive and negative output signals in the proportional path;

filtercapp and filtercapm denote positive and negative outputs to the capacitor that should be connected externally to the chip in PLF case;

vcotunep denotes a positive output signal of the loop filter 130, which is used as a positive control or tuning signal for the VCO 140;

vcotunem denotes a negative output signal of the loop filter 130, which is used as a negative tuning signal for the VCO 140;

sel_cml_divider_ratio denotes a control signal for the selection of a divider ratio for the CML divider 150;

sel_cmos_divider_ratio denotes a control signal for the selection of a divider ratio for the CMOS divider 170;

vco_amplitude_calibration denotes an amplitude calibration control signal for the VCO 140; and vco_frequency_calibration denotes a frequency calibration control signal for the VCO 140 (e.g., feeding into the VCO 140 through a digital finite state machine (FSM) module. The output of this module is a VCO frequency band setting code);

Note that a signal described herein may be implemented as one or more signals, depending on the application. Notations described regarding one figure such as FIG. 1 may also be applicable to another figure, if the same notation is used.

With the PLL circuit 100 operating in a passive mode, the PFD 110 may feed "up" and "down" pulses (i.e., upp, upm, dnp, and dnm) to the CP 120, which may be a single differential CP. Note the term "feed" used herein may be direct or indirect (e.g., through other components). A width of the pulse signals may be programmable to any suitable value, such as 50, 100, 150, or 200 pico seconds (ps). Further, a current of the CP 120 may also be programmable, e.g., ranging from 320 micro Ampere (uA) to 1600 milli Ampere (mA) in 80 uA steps. Each center tap (not shown in the high level diagram) in the differential CP 120 may be directly coupled or connected to a differential resistor-capacitor (RC) filtering network and to differential control inputs of the VCO 140. Thus, the voltage on the positive or negative CP center tap may be equal to a positive or negative control voltage of the VCO 140. The center tap voltages depend on either process, voltage, and temperature (PVT) or an operational frequency of the PLL 100. It should be noted that either the center tap voltage of the CP 120 or the differential and common mode tuning voltages of the VCO 140 may depend on PVT and float within 400 millivolt (mV) range during operation.

In the PLL 100, a common mode feedback circuitry may be implemented to equate VCO and CP common mode voltages. Center tap common mode voltage of the CP 120 may be sensed by a common mode amplifier and compared to a programmable reference voltage threshold generated by a reference voltage generator 180. The comparison result may be applied as a correctional voltage to a PMOS current source in the CP 120. This correction mechanism may increase the dependency of CP "up" and "down" pulse mismatch on the differential VCO tuning voltages, e.g., the operational frequency and temperature of the VCO 140.

An output clock signal of the VCO 140 may be sent to the CML divider 150. An output of the CML divider 150 may be converted to a CMOS signal by the CML to CMOS converter 160, which may be followed by the programmable CMOS divider 170. The CMOS divider 170 may be controlled by a frequency setting register and produce a divided clock signal. The divided clock signal may be fed back to the PFD 110 to create up and down control signals (i.e., upp, upm, dnp, and dnm signals) for the CP 120.

In use, during initialization or powering up, the VCO 140 may go through frequency and amplitude calibration procedures. The frequency calibration, e.g., using vco_frequency_calibration may lead to an optimal VCO band setting, which may guarantee a differential tuning voltage of no more than 200 mV. Similarly, the amplitude calibration, e.g., using vco_amplitude_calibration, may set a VCO amplitude for optimal phase noise performance. Note that the frequency and/or amplitude calibration of the VCO 140 may have manual override.

The loop filter 130 may be a low pass filter with some nodes connected to center taps of the CP 120, e.g., through an analog multiplexer. The loop filter 130 is a PLF, thus it may comprise passive internal components, including a passive integrator and/or a passive differentiator. The internal components in the loop filter 130 may be integrated and programmable on-chip or on the die. However, the loop filter 130 may need at least one capacitor 132 with a relatively large capacitance (e.g., no less than 1 nanofarad (nF)). The capacitor 132 may need to be implemented outside the die, in other words, as an external capacitor. The external capacitor 132 may not be fabricated using a monolithic process together with internal components on the die. For example, if the external capacitor 132 has a capacitance of 1 nF, it may occupy a space or area of about 250000 square microns, which may be the size of about 7 die bumps. Consequently, additional die bumps and precious board space may be required to mount the external capacitor 132 next to the bumps. Further, the external capacitor 132 may introduce leakage over PVT, which may lower performance of the PLL 100.

Disclosed herein are systems, apparatus, and methods for improving the performance of a PLL by implementing an active operation mode. Compared to the passive mode, the disclosed active mode may require less or no external components (e.g., external capacitor), while achieving necessary loop dynamics. In an embodiment, a loop filter may comprise an active integrator, which may comprise a matched pair of differential operational amplifiers (or a single amplifier performing the same function as the matched pair of amplifiers). Common mode feedback may be been added to control differential VCO common mode level. The operation amplifiers used in the loop filter may fix or pin the center tap of a charge pump to a desired reference voltage, which in turn may reduce jitter. Further, the single path CP may be replaced by a CP comprising integral and proportional paths in a differential configuration. A sample and hold (SH) circuit may follow the loop filter, and may be further followed by one or more additional resistor-capacitor (RC) filters. Thus, a tuning voltage feeding into a VCO may be filtered first. The additional filtering may unlock a PLL for 75% of a reference clock period, reducing the noise sensitivity and total jitter. Moreover, to extend PLL lock range over PVT, VCO tuning characteristic may be linearized by utilizing a weighted combination of linear and nonlinear frequency tuning elements in a differential VCO tank. In some cases, usable tuning range may be increased by 25% over PVT.

Figure 2:
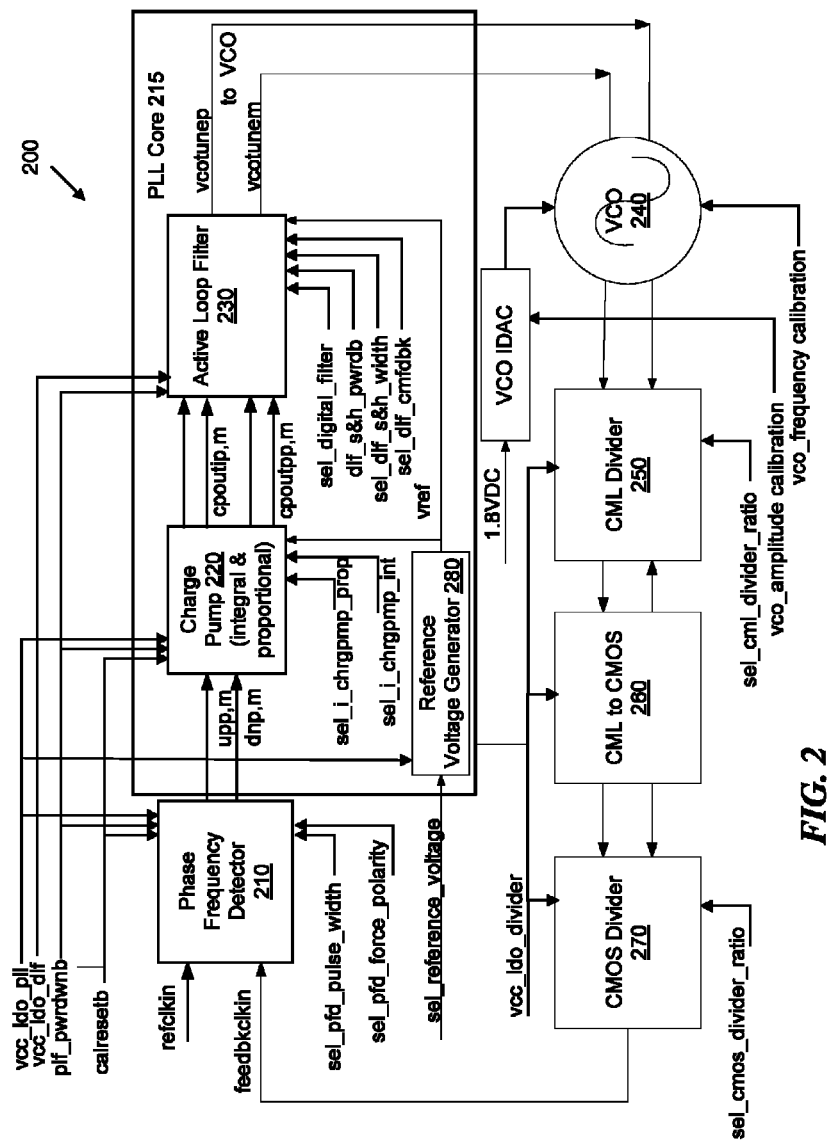
FIG. 2 is a high level schematic diagram of an embodiment of a PLL.

FIG. 2 is a high level schematic diagram of an embodiment of a PLL 200, which may operate in an active mode. Similar to the PLL 100, the PLL 200 may comprise a control path and a feedback path coupled to the control path. The control path may include a PFD 210, a CP 220, and a LF 230. The feedback path may include a VCO 240, a CML divider 250, a CML to CMOS converter 260, and a CMOS divider 270. Note that some aspects of the PLL 200 may be the same with or similar to the PLL 100, thus in the interest of conciseness the following descriptions may focus on differences between the two. A person of ordinary skill in the art will understand common functionalities applicable to both operational modes.

Note that some of the signal notations in FIG. 2 may be defined as follows:

Vcc_Ido_dlf denotes a DC supply voltage used for the loop filter 230;

sel_i_chrgpmp_prop denotes a control signal for selection of current level for a proportional path of the charge pump 220;

sel_i_chrgpmp_int denotes a control signal for selection of current level for an integral path of the charge pump 220;

cpoutip,m denotes positive and negative output signals in the integral path;

sel_digital_filter denotes a control signal for selection of active switched capacitance for the loop filter 230;

dlf_s&h_pwrdb denotes an enabling signal for a sample and hold (SH) component or circuit of the loop filter 230;

sel_dlf_s&h_width denotes a control signal for sample pulse width selection for the sample and hold component of the loop filter 230; and sel_dlf_cmfdbk denotes a control signal for selection of a type of a DLF common mode correction feedback circuitry (a high sel_dlf_cmfdbk may enable an operation amplifier based common mode correction circuitry, and a low sel_dlf_cmfdbk may correct the common mode circuitry using a resistor denoted as Rcmfdbk in FIG. 2).

Figure 3:
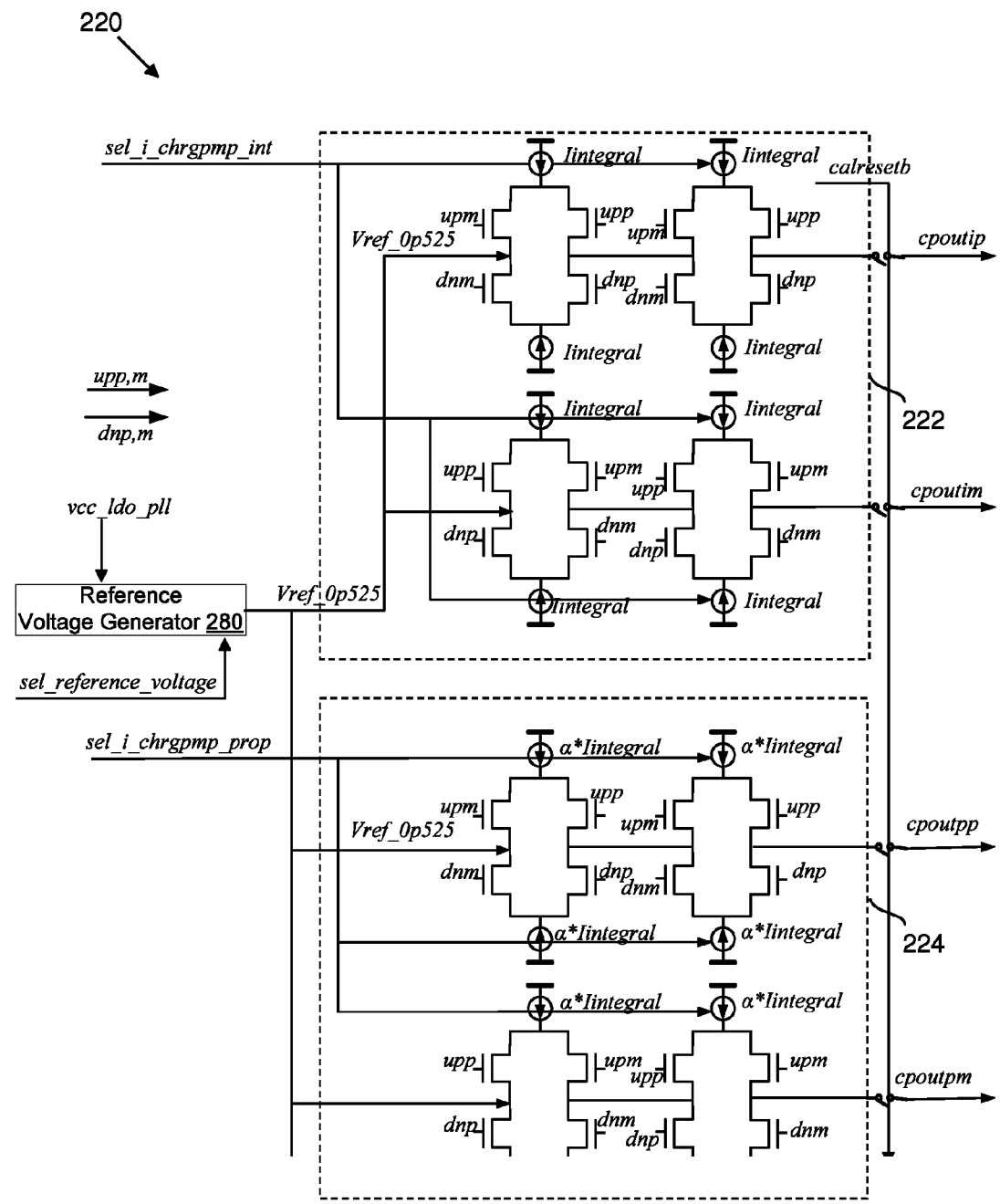
FIG. 3 is a schematic diagram of an embodiment of a CP with an integral path and a proportional path.
Figure 4:
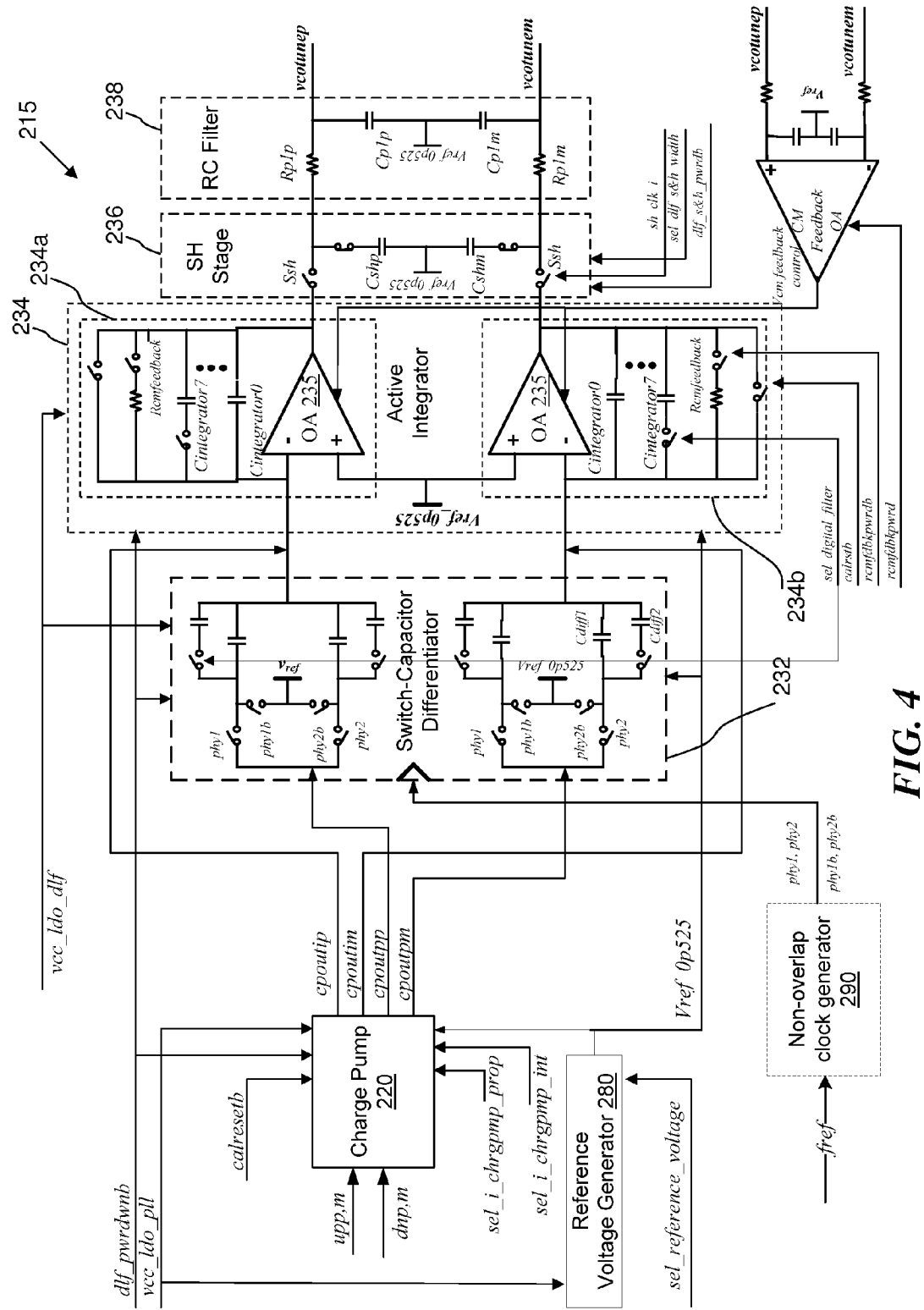
FIG. 4 is a schematic diagram of an embodiment of a PLL core.

As shown in FIG. 2, the PLL 200 may comprise a PLL core 215 including the CP 220, the loop filter 230, and a reference voltage generator 280. Since FIG. 3 and FIG. 4 illustrate certain details of the PLL core 215, with FIG. 3 mostly illustrating the CP 220 and FIG. 4 illustrating part of the PLL core 215, FIGS. 2-4 are discussed herein in concert.

In the PLL 200, output signals of the PFD 210 (i.e., upp, upm, dnp, and dnm signals) may feed into the CP 220. In an embodiment illustrated in FIG. 3, the CP 220 may comprise two differential portions or paths, which are referred herein as an integral path 222 and a proportional path 224, configured to receive output signals from the PFD 210. Compared with the disclosed CP 220, a conventional CP may include only one of the two paths 222 and 224. Thus, each of the integral path 222 and proportional path 224 may be considered as a separate CP if desired, since each of the paths 222 and 224 may include one or more CPs. In this case, the CP 220 is actually a combination of multiple CPs. Thus, it can be seen that a single CP or CP path in a PLF may be reconfigured to work as one of two CP paths in a DLF disclosed herein.

The two paths 222 and 224 may have the same or similar differential architecture, but may have different current strengths. For example, as shown in FIG. 3, input currents of the CP 220 denoted as sel_i_chrgpmp_int and sel_i_chrgpmp_prop may have different amplitudes. Suppose the integral current sel_i_chrgpmp_int has an amplitude denoted as Iintegral, the corresponding proportional current sel_i_chrgpmp_prop may have an amplitude denoted as $\alpha$*Iintegral, where $\alpha$ denotes a ratio between the two current amplitudes. The integral path 222 may produce or generate positive and negative output signals denoted as cpoutip and cpoutim respectively, while the proportional path 224 may generate positive and negative output signals denoted as cpoutpp and cpoutpm respectively.

In an embodiment, the CP 220 may be arranged to improve its linearity and thereby decrease differential output phase noise. The PLL noise may be inversely proportional to a pulse width of the CP 220, "up" versus "down" charge mismatch, and "up" to "down" pulse duration ratio. Specifically, the charge mismatch and the pulse duration ratio may worsen with short control pulses, as charge injection effects may become significant in that case. To maintain continuity in the current delivery process and facilitate fast current switching, while minimizing charge injection, replica charge pumps may be incorporated into the integral path 222 and/or proportional path 224. Thus, the integral path 222 and/or the proportional path 224 may include not only a main CP but also a replica CP. The main-replica arrangement may allow current to flow continuously to and from CP current sources. Continuous current flow may eliminate or reduce charge injection from large current source devices, thereby reducing dynamic charge pump "up" and "down" current mismatch. Further, the operational bandwidth of replica CP may be equal to the main CP, which may allow fast current source switching and generation of rectangular current pulses (e.g., duration as short as 50 ps). Moreover, to further reduce CP mismatch, the main and replica CP center taps may be pinned to reference voltage source(s). Pinning voltages may be accomplished by connecting main CP output to an input of the active integrator 234 directly, or through the switch-capacitor differentiator 232. The voltage pinning approach may allow decoupling of the CP center tap voltages from the VCO tuning voltage, which is an output signal of the active integrator 234. Therefore, "up" and "down" CP current mismatch in a disclosed PLL may depend only on PVT.

The PFD 210, the CP 220, and other components such as reference and feedback clock buffers may be powered by a 1.1 V supply (i.e., vcc_Ido_pll), which may be created by a 10 mA regulator. Therefore, a reference clock input and a feedback clock input may be 1.1 V level CMOS signals. The active loop filter 230 including the switch-capacitor differentiator 232, the differential integrator 234, and the non-overlapping clock generator 290, integrator bias and common mode feedback circuitry, reference voltage generator 280, and differential SH circuit 236 may be arranged in a module or cell sometimes referred to as a digital loop filter (DLF). The loop filter 230 may be a low pass filter and may be powered by a separate 5 mA low drop-out voltage regulator. Both regulators and common mode feedback circuitry may be powered directly by a 1.8 V on-board power supply. In an embodiment, control inputs may be 0.9 V CMOS signals.

Now refer to FIG. 4. Note that some of the notations used in FIG. 4 (and other figures) are listed as follows:

vcc_ldo_dlf denotes a regulated DC voltage for the DLF circuitry supplied by an on-die low drop out (LDO) regulator;

VSS denotes a ground or virtual ground;

vref_0p525 denotes an adjustable reference voltage (e.g., a nominal value of 0.525 volts);

calrestb denotes a switch used to set VCO inputs to the reference voltage by shorting integrator capacitor. The calrestb switch may remain closed during VCO calibration, and may remain open during normal operation;

cint_sel denotes a switch coupled to a capacitor in the active integrator 234 and used to increase or decrease integrator capacitance value, thereby adjusting PLL bandwidth and transfer characteristics;

Cintegrator<0:7> denotes values of capacitors in the active integrator 234 (e.g., on pF range which is much smaller than the external capacitor 132 in FIG. 1);

Cintegrator0 to Cintegrator 7 denotes adjustable integrator capacitors connected to cint_sel switches;

rcmfdbkpwrdb denotes a switch coupled to a resistor in the active integrator 234 and used to set the output common mode voltage when operational amplifier (OA) common mode feedback is disabled by "rcmfdbkpwrd" digital control;

Rcmfdbk denotes a resistor in the loop filter integrator that is used to implement common mode feedback when low noise and low accuracy common mode feedback is required;

sh_clk_i denotes a sample and hold input clock. Its frequency may be equal to the reference closk and its width adjusted by sel_dlf_s&h_width digital control;

phy1 denotes a switch coupled to a capacitor and controlled by phy1 clock at half reference rate. That clock may be generated by the non-overlapping clock generator 290;

phy1b denotes a switch coupled to a capacitor and controlled by phy1b clock at half reference rate. That clock may be generated by the non-overlapping clock generator 290 and complimentary but non-overlapping to the phy1;

phy2 denotes a switch controlled by phy2 clock at half reference rate. That clock may be generated by the non-overlapping clock generator 290;

phy2b denotes a and controlled by phy2b clock at half reference rate. That clock may be generated by the non-overlapping clock generator 290 and complimentary but non-overlapping to the phy2;

Cdiff1 denotes a first differentiator capacitor;

Cdiff2 denotes a second differentiator capacitor;

Sel_reference_voltage denotes a digital control signal for adjusting reference voltage;

Dlf_pwrdnb denotes a signal used to shut down integrators and integral CPs allowing PLL to operate with external capacitor (i.e., in the passive mode);

vtunep is a positive output of the loop filter 230 (i.e., the same with vcotunep in FIG. 1), which is a tuning voltage for the VCO 240; and vtunem is a negative output of the loop filter 230 (i.e., same with vcotunem in FIG. 1).

As shown in FIG. 4, the loop filter 230 may comprise a differentiator 232 comprising switches and capacitors. Thus, the differentiator 232 may be referred to simply as a switch-capacitor differentiator. In use, the proportional path 224 of the CP 220 may be coupled or connected to the differentiator 232, which may work at half the speed or rate of the reference clock. Clocks for the switch-capacitor differentiator 232 may be generated by a non-overlapping clock generator 290. Signals cpoutip and cpoutim generated by the integral path 222 may directly feed into an active integrator 234 residing in the loop filter 230, while signals cpoutpp and cpoutpm generated by the proportional path 224 may first be differentiated by the differentiator 232.

The differentiator 232 may comprise a plurality of switches (e.g., phy1, phy1b, and phy2) and one or more capacitors (e.g., Cdiff1, Cdiff2). Any of the one or more capacitors may be coupled in series to at least one of the plurality of switches. The differentiator 232 coupled to the active integrator 234 may be configured to receive two input signals (e.g., cpoutpp and cpoutpm) from the proportional path 224 of the CP 220, generate two output signals by differentiating the two input signals, and feed the two output signals to the differential integrator via two nodes connected to the negative inputs of the OAs 235. Each of these two output signals may be added by their respective cpoutip and cpoutim signals at the two nodes.

As shown in FIG. 4, the active integrator 234 may comprise two portions or parts 234a and 234b arranged in a differential configuration. The pair of differential portions 234a and 234b may each comprise an OA and a number of capacitors and resistors arranged in a parallel fashion. In an embodiment, a positive output of the integral path 222 and a positive output of the switch-capacitor differentiator 232 are summed at the input of the positive portion 234a, while a negative output of the integral path 222 and a negative output of the switch-capacitor differentiator 232 are summed at the input of the negative portion 234b. Input-to-output transfer functions of the active integrator 234 may have one or more zeros and poles. In an embodiment, a zero location generated by the proportional path 224 and the switch-capacitor differentiator 232 may create a zero frequency, which may stabilize the PLL 200. In an embodiment, sizes of capacitors (e.g., Cdiff1 and Cdiff2) used in the switch-capacitor differentiator 232 may be set to about ⅓ to ⅙ of a size of an integrator capacitor (e.g., Cintegrator0, . . . , or Cintegrator7) used in the active integrator 234. This capacitance setting may help to achieve shortest lock time. The zero frequency generated by the switch-capacitor differentiator 232 may be proportional either to a reference clock period or to a (i.e., a current ratio between the integral path 222 and the proportional path 224). Further, the zero frequency may be inversely proportional to the value of an integrator capacitor (e.g., Cintegrator0, . . . , or Cintegrator7). In an embodiment, the zero frequency denoted as $f_z$ may be expressed as:

$$f_z = \frac{1}{2*\pi} * \frac{I_{cp\_integral}}{I_{cp\_proportional}} * F_{reference} \quad (1)$$

where Icp_proportional equals sel_i_chrgpmp_prop, Icp_integral equals sel_i_chrgpmp_int, and Freference denotes a reference frequency.

Further, a natural frequency (denoted as $f_n$) of the PLL 200 may be directly proportional to a loop gain and inversely proportional to the value of an integrator capacitor (e.g., Cintegrator0). A bandwidth of the PLL 200 may be adjustable. For example, by switching in or out up to 7 active integrator capacitor units (e.g., Cintegrator1 to Cintegrator7), the bandwidth may be adjusted by three bits. In an embodiment, the active integrator 234 may comprise any suitable number of capacitors coupled to the OAs 235, wherein none of the capacitors has a value greater than 1 pF, and wherein the active integrator does not contain any external capacitor. Additional bandwidth adjustment may be made available by changing the loop gain of the PLL 200, e.g., using different sel_i_chrgpmp_int settings. In some embodiments, achievable PLL bandwidth is from 1.0 Megahertz (MHz) to 5 MHz at 156.25 MHz clock rate and an output frequency at clock distribution of 5-6.4 Gigahertz (GHz). For example, an output frequency of the PLL denoted as $f_u$ may be expressed as:

$$F_u = \frac{1}{2*\pi} * \left( K*R_z + \sqrt{(K*R_z)^2 + 4*\frac{K}{C_{integral}}} \right), \quad (2)$$

where the loop gain:

$$K = I_{cp_{integral}} * K_{vco} * \frac{1}{2*\pi*N_{divider}},$$

and $$R_z = \frac{I_{cp\_proportional}}{I_{cp\_integral}} * \frac{1}{C_{integral}F_{reference}},$$

Kvco denotes a gain of the VCO 240, $N_{divider}$ equals a sum of division ratios of the CML 250 and CMOS dividers 270 (e.g., $N_{divider}=N_{cml}+N_{cmos}$ and may be between 20 and 50), $C_{integral}$ denotes a capacitance of any the capacitors in the active integrator 234.

In some embodiments, a value of Icp_proportional may be programmable from 20 uA-160 mA in 20 uA steps. Further, a value of Icp_integral may be programmable from 320 uA-1600 mA in 80 uA steps. Thus, current adjustment in the CP 220 may allow setting a (i.e., proportional to integral charge pump ratio) between roughly 10 to 40 times, which in turn may allow greater than 45 degrees phase margin through the entire range of PLL bandwidth adjustment.

Based on the input tuning signals, the VCO 240 may generate an oscillating signal with a locked phase and/or frequency, which is a feedback signal (e.g., feedback voltage denoted as Vcm feedback control in FIG. 4). Directly or indirectly based on this feedback signal(s), components in the control path (e.g., PFD 210, CP 220, and phase loop filter 230) may operate to generate locked phases or frequencies. In the feedback path, the feedback signal may feed into the CML divider 250, followed by the CML to CMOS converter 260, and then followed by the CMOS divider 270. A person of ordinary skill in the art will understand that modifications can be made within the scope of this disclosure. For example, certain modules or components (e.g., CML to CMOS converter 260 and the CMOS divider 270) may be arranged differently or skipped.

Compared with one or more passive integrators that may be used in a conventional PLF, the active loop filter 230 with one or more active integrators may offer various advantages. For a first example, a positive node of an OA in the active integrator 234 may be connected to the reference voltage generator 280, which may produce a reference voltage equaling about half of Vcc_Ido_pll. If Vcc_Ido_pll=1.1 volts, the reference voltage may equal 0.525 V (thus 0p525 is used in some figures to denote the reference voltage). Since the center taps of the CP 220 may be connected to the OAs 235 of the active integrator 234, it can be seen that the active integrator 234 may set all center tap voltages of the CP 220 to a known value (e.g., 0.525 V). In an embodiment, all center taps of the CP 220 are coupled to an input of at least one of the OAs 235. The voltage stability may allow reduction of the "up" to "down" current mismatch in a lock condition over temperature. This voltage stability may also lead to partial reduction of the said mismatch over process corners.

For a second example, the use of the active integrator 234 may simplify a differentiator switching network. That is, the active integrator 234 may help eliminate a requirement for dual Gm discharge amplifiers, which may otherwise be required to discharge differentiator capacitors. Such amplifiers would consume more current than the active integrator 234 because of their dual Gm structure. In this disclosure, voltages may be discharged to the reference voltage using relatively simpler amplifiers (e.g., the OAs 235 do not have to be dual Gm amplifiers). For a third example, the common mode voltage of the OAs 235 may be set to a value optimal for the VCO 240 by using an analog common mode feedback circuitry. As shown in FIG. 4, a Vcm feedback control signal generated by the VCO 240 is fed into the two OAs 235. Note that the active integrator 234 may comprise one or more OAs 235, each of which may be configured to receive the feedback signal from the VCO 240. As shown in FIG. 4, the active integrator 234 is a differential integrator comprising a differential pair of OAs 235, wherein the differential pair of OAs 235 are both configured to receive the feedback signal.

For a fourth example, the active integrator 234 may allow for additional zero(s) and pole(s) aside from the main integrator capacitor to reshape its signal and noise transfer functions. In some applications, non-dominant additional zero(s) and pole(s) may be implemented. In an embodiment, up to two additional poles may be realized using two RC filters, such as the RC filter 238 shown in FIG. 4. The RC filter 238 may comprise at least one pair of a resistor (Rp1p or Rp1m) and capacitor (Cp1p or Cp1m). Further, the RC filter 238 may be coupled to the active integrator directly or via a sample and hold circuit 236. The RC filter 238 may be configured to filter the one or more tuning signals generated by the active integrator 234 or the SH circuit 236. Filtering may generate one or more filtered tuning signals, which are then fed to the VCO 240. The RC filter may lower clock feed through and residual thermal noise from the VCO 240, the CML divider 250, the CMOS divider 270, and the CP 220.

As shown in FIG. 4, the differentiator 232 may have two differentiator capacitors denoted as Cdiff1 and Cdiff2. The Cdiff2 capacitor may be controlled by the external control signal "sel_digital_filter". Specifically, the differentiator 232 may comprise one more capacitor branches, which can be switched in or out by static or dynamic control signal(s). The static signal "sel_digital_filter" may switch in or add) various amounts of "Cdiff2" (capacitance) to Cdiff1" versus a value of an integration capacitor denoted as "Cintegrator". The amount of "Cdiff2" added to "Cdiff1" changes a locking profile of the PLL 200 and may control the amount of the tuning voltage overshoot for different Cintegral values. In addition, "Cdiff2" capacitor may be switched in (added to "Cdiff1") by a control signal synchronized with reference clock divided by an integer ratio N.

The sample and hold circuit 236 may be incorporated into the loop filter 230 to achieve further PLL jitter reduction. Specifically, outputs of the active integrator 234 may feed into the sample and hold circuit 236, which may also have a differential configuration. The sample and hold circuit 236 may contain switches and adjustable capacitors connected in series to a differential virtual ground. As shown in FIG. 4, the sample and hold circuit 236 comprises capacitors (Cshp and Cshm), which may charge (by closing switches Ssh and other switches) for roughly 20% of the reference clock period. Charging may generate a tuning signal (e.g., control voltage) based on which the VCO 240 operates. After charging, the capacitors may hold (by opening switches Ssh and other switches) the control voltage for the rest of the clock period. Note that during the hold period, the PLL 200 may be unlocked, thus neither CP noise nor deterministic or random noise from the active integrator 234 may propagate to the control pins of the VCO 240. In use, voltage charging and holding by the sample and hold circuit 236 may be executed every reference clock period. Further, the duration of charging and/or holding stages may be adjustable. Clocks for the differential sample and hold circuit 236 may be generated by the non-overlapping clock generator 290.

The sample and hold circuit 236 coupled to the active integrator 234 may be configured to receive a reference clock signal (e.g., sh_clk_i) with a period comprising a first duration or section (e.g., about 20% of the period) and a second duration (e.g., about 80% of the period). The first duration is a sampling duration, thus the sample and hold circuit 236 may close at least one switch (e.g., Ssh) of the SH circuit 236 at the beginning of the first duration, and sample the tuning signal from the active integrator during the first section. Sampling may be done by charging at least one capacitor (e.g., Cshp and/or Cshm) of the SH circuit 236. The second duration is a holding duration, thus the sample and hold circuit 236 may open the at least one switch (e.g., Ssh) at the beginning of the second duration, and hold the charge on the at least one capacitor during the second duration. A ratio of the sample duration to the hold duration may be configurable by the "sel_dlf_s&h_width" control signal. This ratio may have any suitable value (e.g., from 1/5 to 1/20).

Figure 5:
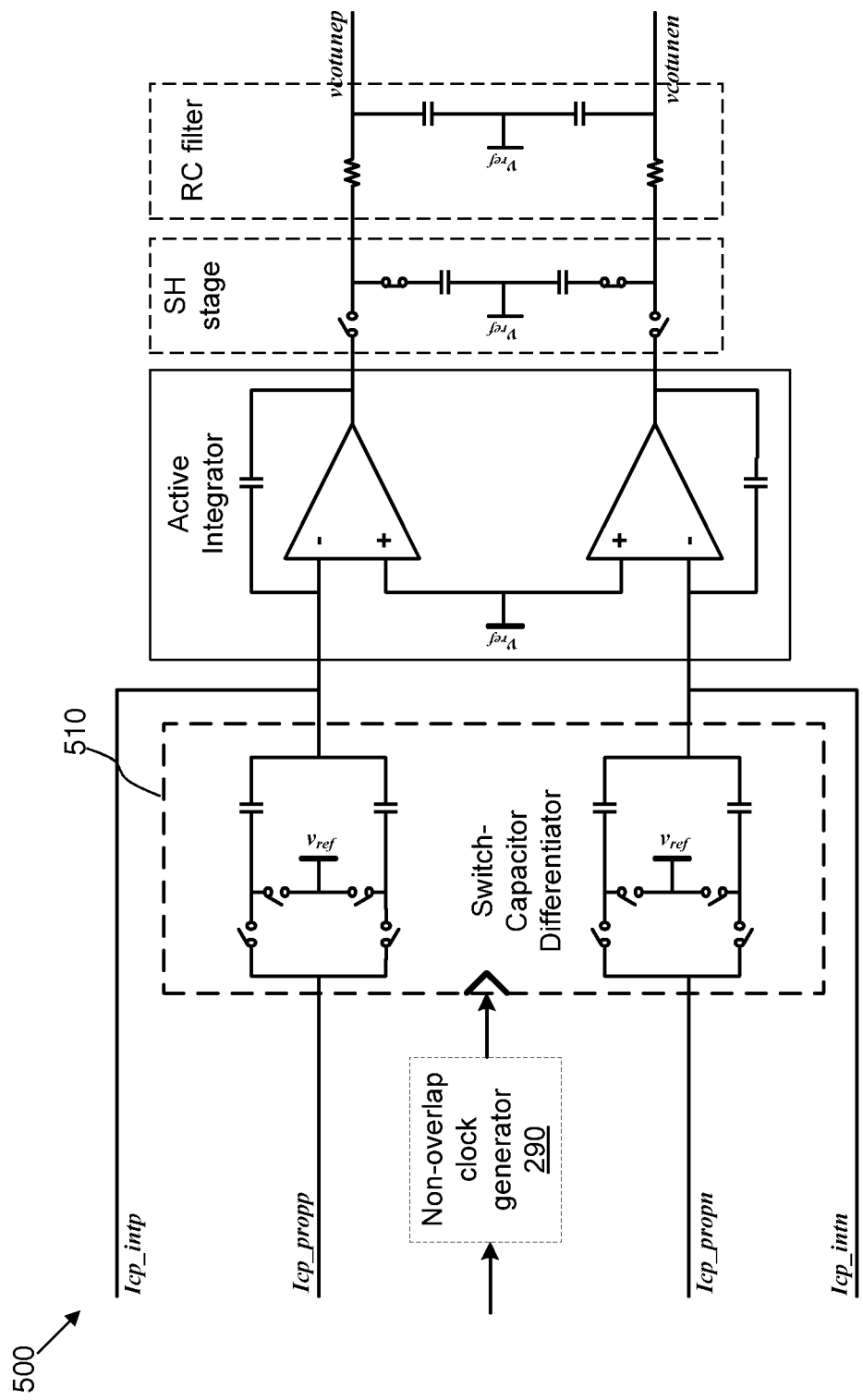
FIG. 5 is a schematic diagram of part of the components in an embodiment of an active loop filter.

FIG. 5 illustrates part of the components in an embodiment of an active loop filter 500, which may be largely similar to the loop filter 230 except that the structure of its differentiator 510 may be different from the differentiator 232. As shown in FIG. 5, the differentiator 510 has two symmetric portions arranged in a differential configuration that is different from the differentiator 232. In an embodiment, the differentiator capacitor in the differentiator 510 may not be adjustable. Using the differentiator 232 in FIG. 4 and the differentiator 510 in FIG. 5 as examples, it can be seen that, due to an active integrator, the differentiators disclosed herein may be made simpler compared to conventional differentiator structures. Specifically, the disclosed differentiators may comprise only passive elements or components, such as switches, capacitors (and other passive elements if desired). No active component (e.g., OA) may be needed in the differentiator. The switches and capacitors may be arranged in series, in parallel, or both, or in any other structure for proper functioning. It should be understood that a differentiator or any other component disclosed herein may be flexibly designed to have various structures, as long as principles of the present disclosure are kept.

Conventionally, a VCO tank (e.g., the VCO 140) may comprise an inductor and at least one capacitor forming an inductor-capacitor (LC) circuit for tuning in different frequency bands. For example, the following formula shows a conventional way of adjusting VCO tank capacitance (denoted as $C_{tank}(n)$) over frequency bands.

$$C_{tank}(n) = C_{const} + n * C_{linear_{unit}} * + C_{nonlinear_{unit}} * \text{constant}, \quad (3)$$

where n denotes a VCO band number, Cconst denotes a constant portion of $C_{tank}(n)$ that does not vary with frequency, $C_{linear_{unit}}$ and $C_{nonlinear_{unit}}$ denotes linear and nonlinear portions of $C_{tank}(n)$, the term "constant" denotes a constant number dependent on the capacitance of a varactor and other VCO parameters.

In a conventional VCO tank, due to the inherent nonlinearity of a LC circuit, the spacing between frequency-tuning voltage curves may be nonlinear, e.g., resembling a parabolic curve. Sometimes, the VCO tuning gain across LC VCO bands may vary as much as several hundred percent. The following formula shows a tuning gain of a conventional VCO, where $F_{vco}$ denotes free-running VCO frequency, and $V_{tune}$ denotes differential tuning voltage for the VCO.

$$VCO_{tuning\_gain}(n) = \frac{dF_{vco}}{dV_{tune}} \approx \frac{(\partial)C_{tank}(n)}{\partial V_{tune}}, \quad (4)$$

Figure 6:
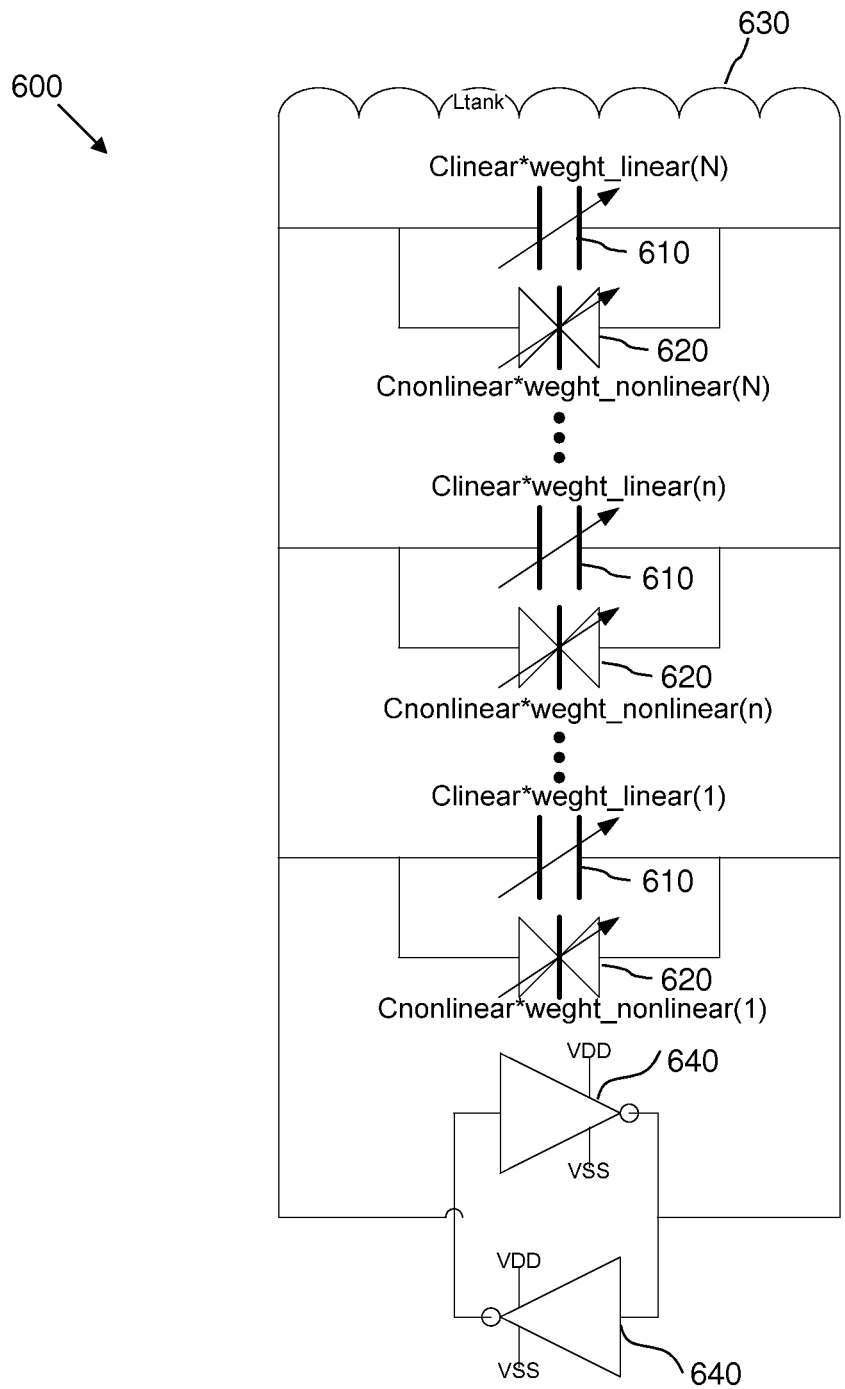
FIG. 6 is a schematic diagram of part of components used in an embodiment of a VCO.

In this disclosure, the tuning range of a PLL may be extended by using a weighed combination of linear and non-linear tuning elements in an inductor-capacitor (LC)-based VCO tank. FIG. 6 illustrates part of components used in an embodiment of a VCO 600, which may be the same or similar to the VCO 240. The VCO 600 may be used to extend PLL lock range over PVT and reduce VCO tuning gain variation across VCO bands. VCO tuning characteristics (e.g., frequency versus voltage) may be linearized by utilizing a weighted combination of linear and nonlinear frequency tuning elements in a single differential LC-based VCO tank.

As shown in FIG. 6, linear tuning elements in a disclosed VCO tank may include N capacitors 610 and non-linear elements may include N varactors 620, where N is a positive integer. The capacitors 610 may be made of metallic material (s), and the varactors 620 may be tunable metal-oxide-semiconductor (MOS) varactors. The VCO tank 600 may further comprise an inductor 630 and OAs 640, which are coupled to source voltages and ground denoted as VDD and VSS respectively. In a weighted combination, the capacitance of a varactor 620 number n, denoted as Cnonlinear, may be multiplied by a weighted coefficient denoted as weight_nonlinear (n), where n is an integer between 1 and N. Similarly, the capacitance of a capacitor 610 number n, denoted as Clinear, may be multiplied by another weighted coefficient denoted as weight_linear(n). Since the two capacitors are in parallel, their total capacitance value (denoted as Ctotal(n)) may be a weighted sum of the two capacitance values, that is, $$C\text{total}(n) = C\text{linear} * \text{weight\_linear}(n) + C\text{nonlinear} * \text{weight\_nonlinear}(n), \quad (5)$$

In implementation, when the VCO band of operation changes, the weighted combination scheme may keep the ratio of variable-to-constant capacitance constant. Accordingly, the weighted combination may equalize band spacing and reduce VCO gain variation across different frequency bands. The weighted coefficient of each element may depend on factors such as VCO band number, MOS varactor capacitance polynomial coefficients, total number of VCO bands, VCO frequency, and so forth. For example, one method of adjustment for the VCO tuning capacitance may be illustrated by the following formulas:

$$C_{tank}(n) = \qquad (6)$$
$$C_{const} + C_{linear_{unit}} * \text{Weight}_{linear} + C_{nonlinear_{unit}} * \text{Weight}_{nonlinear}$$

$$\text{Weight}_{linear}=n; \text{Weight}_{nonlinear}=\text{constant}+n \qquad (7)$$

In this case, linear capacitance may change in the same way as in a conventional VCO, but a number of varactors may follow a band number n of the VCO, which is different from the conventional VCO (number of varactors may be constant as in conventional VCO). In implementation, the weights for linear and/or nonlinear capacitors may be adjusted based on the band number. As an example, script or pseudo code shown in Table 1 below may be used to achieve an optimal VCO gain and band spacing variation for specific VCO design. A person with ordinary skill in the art will understand the script.

TABLE 1 an examplary script for linearizing a VCO

```
% VCO tune
close all
clear all
N=32;    % number of VCO bands
n=[1:N]; % band number
Lmax=100; % number of tuning voltage points
Ltank=400e-12; % tank inductor value
Cconst = 350e-15; % constant tank cap including parasitic capacitance
Clin_unit =20e-15; % unit tank tuning cap [fF]
Cvar0 = 4e-15; % varactor capacitance zero order tuning coefficient
alpha = -1; % varactor capacitance first order tuning coefficient
betha = -0.3*alpha; % varactor capacitance second order tuning coefficient
gamma=1;    % nonlinear capacitance tuning coefficient
delta=0.5;    % constant capacitance tuning coefficient
Wlinear = n-n. delta; % band dependent variable capacitance weight
Wnonlinear = 10+ n. gamma; % band dependent constant capacitance
weight for 1=1:Lmax
    Vtune(1) = 0.5*(1-1)/Lmax;
    Cnonlinear_unit(1)=Cvar0*(1+alpha*Vtune(1)+betha*Vtune(1)^2);
    Ctank(1,:)=Cconst + Clin_unit*Wlinear + Cnonlinear_unit(1)*
    Wnonlinear;
    Fvco(1,:)=1/2/pi./sqrt(Ltank*Ctank(1,:));
end
figure(1), plot(Vtune, Fvco/1e9, 'LineWidth',2), grid on; %
xlabel('VCO tuning voltage [V]')
ylabel('VCO frequency [GHz]')
```

In an embodiment, some or all frequency-voltage curves may be linearized with a maximal spacing between each curve. As a result, a maximal frequency coverage of 45-50% may be achieved by one VCO, and the VCO tuning gain variation may be reduced to 75%.

Figure 7:
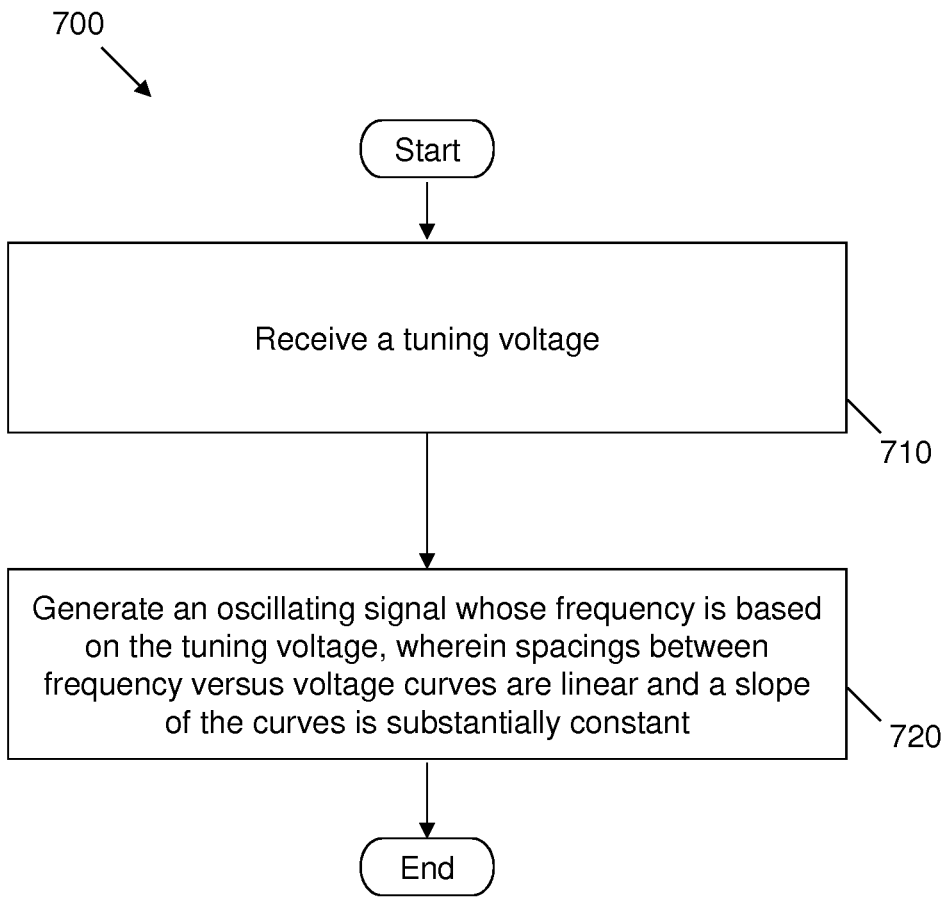
FIG. 7 is a schematic diagram of an embodiment of a VCO linearization method.

FIG. 7 illustrates an embodiment of a VCO linearization method 700, which may be implemented by a VCO in a PLL, such as the VCO 140 or the VCO 240. The method 700 may start in step 710, where the method 700 may receive a tuning voltage. Note that the tuning voltage may be a single signal or a combination of multiple tuning signals (e.g., vcotunep and vcotunem signals in FIG. 4). In step 720, the method 700 may generate an oscillating signal whose frequency is based on the tuning voltage. The oscillating signal is a feedback signal, which can be used in the feedback path of the PLL. Recall that a relationship between the tuning voltage and the frequency of the oscillating signal is characterizable via frequency versus voltage curves.

Generating the oscillating signal in step 720 may be performed in a way such that spacings between frequency versus voltage curves are linear, and a slope of the curves is substantially constant (note that variations within a certain limit are possible). In an embodiment, to enable linear tuning characteristics, the VCO comprises a number of linear elements and a number of nonlinear elements, wherein a total capacitance of the VCO is a weighted combination of capacitances of the linear elements and capacitances of the nonlinear elements. Further, each of the linear and nonlinear elements corresponds to a weight in the weighted combination, and the weight of each element is determined based on a VCO band number.

It should be understood that a PLL disclosed herein may be used for any application. For example, the PLL may be included into a 12 Gigabits per second (Gb/s) Backplane Input/Output (I/O) transciever.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means+/−10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. As used herein, the term "based on" followed by a parameter or an activity means partially or non-exclusively based on the parameter or the activity, respectively, unless otherwise specified. For example, if a first quantity is described as being "based on" a second quantity, the first quantity may not be limited to being solely or exclusively based on the second quantity, unless otherwise specified. That is, the first quantity may also be based on other unnamed factors or quantities. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A circuit comprising:
    a loop filter, wherein the filter comprises an active integrator configured to generate one or more tuning signals; and
    a voltage-controlled oscillator (VCO) coupled to the loop filter and configured to generate a feedback signal based on the one or more tuning signals,
    wherein generating the one or more tuning signals is based on the feedback signal,
    wherein the loop filter is implemented on an integrated chip, and
    wherein the loop filter does not comprise a capacitor that is external to the integrated chip and used to generate the tuning signals.

2. A circuit comprising:
    a loop filter, wherein the filter comprises an active integrator configured to generate one or more tuning signals; and
    a voltage-controlled oscillator (VCO) coupled to the loop filter and configured to generate a feedback signal based on the one or more tuning signals,
    wherein generating the one or more tuning signals is based on the feedback signal,
    wherein the active integrator is a differential integrator comprising a differential pair of operational amplifiers (OAs), and
    wherein the differential pair of OAs are both configured to receive the feedback signal.

3. A circuit comprising:
    a loop filter, wherein the filter comprises an active integrator configured to generate one or more tuning signals; and
    a voltage-controlled oscillator (VCO) coupled to the loop filter and configured to generate a feedback signal based on the one or more tuning signals,
    wherein generating the one or more tuning signals is based on the feedback signal, and
    wherein the active integrator comprises one or more operational amplifiers (OAs) each configured to receive the feedback signal.

4. The circuit of claim 3, wherein the active integrator further comprises a number of capacitors coupled to the one or more OAs, wherein none of the capacitors has a value greater than 1 picofarad (pF), and wherein the active integrator does not contain any external capacitor.

5. The circuit of claim 3, wherein the loop filter further comprises a sample and hold (SH) circuit coupled to the active integrator and configured to:
    receive a reference clock signal with a period comprising a first duration and a second duration;
    close at least one switch of the SH circuit at the beginning of the first duration;
    sample the one or more tuning signals during the first duration by charging at least one capacitor of the SH circuit;
    open the at least one switch of the SH circuit at the beginning of the second duration; and
    hold the charge on the at least one capacitor during the second duration.

6. The circuit of claim 5, wherein the loop filter further comprises at least one additional resistor-capacitor (RC) circuit coupled to the SH circuit and configured to:
    filter the one or more tuning signals to generate one or more filtered tuning signals; and
    feed the filtered tuning signals to the VCO.

7. The circuit of claim 3, wherein the loop filter further comprises a differentiator coupled to the differential integrator, wherein the differentiator is configured to:
    receive two input signals;
    generate two output signals by differentiating the two input signals; and
    feed the two output signals to the differential integrator via two nodes,
    wherein generation of the one or more tuning signals is based on the two output signals.

8. The circuit of claim 7, wherein the differentiator comprises a plurality of switches and one or more capacitors, wherein any of the one or more capacitors is coupled in series to at least one of the plurality of switches, and wherein the differentiator contains no active component.

9. The circuit of claim 7, further comprising:
    a charge pump (CP) comprising an integral path and a proportional path, coupled to the differentiator, coupled to the active integrator, and configured to:
    generate the two input signals and two additional signals based on the feedback signal;
    feed the two input signals to the differentiator using the proportional path; and
    feed the two additional signals to the active integrator directly using the integral path and via the two nodes,
    wherein generation of the one or more tuning signals is further based on the two additional signals.

10. The circuit of claim 9, wherein all center taps of the CP are coupled to an input of at least one of the OAs.

11. The circuit of claim 3, wherein the VCO comprises one or more linear elements and one or more nonlinear elements, and wherein values of the linear and nonlinear elements are configured such that tuning characteristics of the VCO are linearized.

12. The circuit of claim 11, wherein the linear and nonlinear elements are capacitors and varactors respectively, and wherein configuration of the linear and nonlinear elements uses a weighted combination of capacitances of the capacitors and varactors.

13. A method implemented by a voltage-controlled oscillator (VCO) comprising:
    receiving a tuning voltage; and
    generating an oscillating signal whose frequency is based on the tuning voltage,
    wherein a relationship between the tuning voltage and the frequency of the oscillating signal is characterizable via frequency versus voltage curves, and wherein spacings between frequency versus voltage curves of the VCO are linear and a slope of the frequency versus voltage curves is substantially constant.

14. The method of claim 13, wherein the VCO comprises a number of linear elements and a number of nonlinear elements, and wherein a total capacitance of the VCO is a weighted combination of capacitances of the linear elements and capacitances of the nonlinear elements.

15. The method of claim 14, wherein each of the linear and nonlinear elements corresponds to a weight in the weighted combination, and wherein the weight of each element is determined based on a VCO band number.

16. A phase lock loop (PLL) comprising:
an active low pass filter configured to generate one or more tuning signals; and
a voltage-controlled oscillator (VCO) coupled to the active low pass filter and configured to:
generate a feedback signal based on the one or more tuning signals; and
feed the feedback signal to the active low pass filter.

17. The PLL of claim 16, wherein the active low pass filter comprises a pair of operational amplifiers (OAs) coupled to each other in a differential configuration and configured to receive the feedback signal.

18. The PLL of claim 17, wherein the active low pass filter further comprises a sample and hold (SH) circuit coupled to the OAs and configured to:
receive a reference clock signal with a period comprising a first duration and a second duration;
sample the one or more tuning signals during the first duration by charging at least one capacitor of the SH circuit; and
hold the charge on the at least one capacitor during the second duration.

19. The PLL of claim 17, wherein the loop filter further comprises at least one additional resistor-capacitor (RC) circuit coupled to the active low pass filter and configured to:
filter the one or more tuning signals to generate one or more filtered tuning signals; and
feed the filtered tuning signals to the VCO.

20. The PLL of claim 17, wherein the active low pass filter further comprises a differential differentiator coupled to the pair of OAs, wherein the differential differentiator is configured to:
receive two input signals;
generate two output signals by differentiating the two input signals; and
feed the two output signals to the differential integrator via two nodes,
wherein generation of the one or more tuning signals is based on the two output signals.

* * * * *